(12) United States Patent
Kim

(10) Patent No.: US 8,133,766 B2
(45) Date of Patent: Mar. 13, 2012

(54) FUSE OF SEMICONDUCTOR DEVICE AND METHOD OF FORMING THE SAME

(75) Inventor: Hyung Kyu Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 69 days.

(21) Appl. No.: 12/640,311

(22) Filed: Dec. 17, 2009

(65) Prior Publication Data

US 2011/0024872 A1  Feb. 3, 2011

(30) Foreign Application Priority Data

Jul. 29, 2009 (KR) .................. 10-2009-0069431

(51) Int. Cl.
*H01L 21/82* (2006.01)

(52) U.S. Cl. ...................... 438/132; 257/529

(58) Field of Classification Search ............... 438/132; 257/529

See application file for complete search history.

(56) References Cited

U.S. PATENT DOCUMENTS

| 2002/0014680 A1* | 2/2002 | Tottori ............... 257/529 |
| 2007/0102786 A1* | 5/2007 | Ido et al. ............ 257/529 |
| 2009/0230506 A1* | 9/2009 | Park ................... 257/529 |

FOREIGN PATENT DOCUMENTS

KR  1020070076282 A  7/2007

* cited by examiner

*Primary Examiner* — Ha Tran T Nguyen
*Assistant Examiner* — Shaun Campbell

(57) ABSTRACT

A fuse of a semiconductor device includes first fuse metals formed over an underlying structure and a second fuse metal formed between the first fuse metals. Accordingly, upon blowing, the fuse metals are not migrated under conditions, such as specific temperature and specific humidity. Thus, reliability of a semiconductor device can be improved.

7 Claims, 6 Drawing Sheets

FUSE OF SEMICONDUCTOR DEVICE AND METHOD OF FORMING THE SAME

CROSS-REFERENCE TO RELATED APPLICATION

The priority of Korean patent application No. 10-2009-0069431 filed Jul. 29, 2009, the disclosure of which is hereby incorporated in its entirety by reference, is claimed.

BACKGROUND OF THE INVENTION

The present invention relates to a semiconductor device and a method of forming the same and, more particularly, to a fuse of a semiconductor device, which are capable of minimizing the migration of copper (Cu) after a blowing process.

A semiconductor device, such as a memory device and memory merged logic (MML), includes numerous memory cells for storing data. If any one of the memory cells is faulty, the entire semiconductor device is determined to be faulty, resulting in a lowered yield. However, to discard the entire semiconductor device as being a faulty product although only some of the cells have failed is wasteful. Accordingly, a memory device or a semiconductor device including a large amount of memory requires a repair function in order to secure a higher yield. The repair method in semiconductor devices is chiefly a method of replacing a faulty memory cell with a redundant memory cell. In order to replace the faulty memory cell with the redundant memory cell, fuses that can cut a line are used. Accordingly, a number of fuses are used in the semiconductor device, and the fuses can be cut using a laser. These fuses can be selectively cut according to the test results.

A repair method using a redundant cell uses the word line of the redundant cell for replacing a word line of a failed cell and a bit line of the redundant cell for replacing a bit line of a failed cell. To this end, a memory device includes a circuit for replacing an address of the faulty cell with an address of the redundant cell when the faulty cell is detected through a test after wafer processing. Accordingly, if the cell address corresponding to the faulty cell is inputted when the memory device is used, data of the reserved cell that has replaced the faulty cell is accessed.

A typical repair method changes the path of an address by blowing a fuse using a laser beam. Accordingly, a typical memory device is manufactured with a fuse region for changing an address path by blowing the fuse using a laser. A fuse includes a wiring line designed to be blown by the irradiation of the laser, and a fuse box includes a region including the fuse and its periphery.

In the fuse blowing process an insulating layer having a specific thickness covers the fuse and the fuse of a failed cell is then cut by irradiating with a laser. In this case, the laser energy passes through the insulating layer without being absorbed because the insulating layer has the same properties as glass. Thus, most of the laser energy is absorbed by the fuse. The fuse is thermally expanded by the laser energy, and so the fuse is blown and cut. In other words, after the blowing process, the fuse that has absorbed the laser energy must be completely evaporated and removed through the air.

However, if the fuse is not completely evaporated, residue remains in the fuse blowing region, which may result in a reconnection of the fuse ends. In this case, an address repair process is not properly performed because a fuse that should have been cut is still electrically connected. A similar problem can occur when fuse metals (e.g., copper) migrate under high temperature and high humidity conditions, resulting in a reconnection of the fuse ends.

BRIEF SUMMARY OF THE INVENTION

An embodiment of the invention is directed to solving a problem that blowing is determined not to have been performed even though the blowing has been performed because copper (Cu) included in a fuse portion migrates when fuse blowing and reliability test are performed due to the properties that copper (Cu) migrates under conditions of specific temperature, humidity, etc.

According to an aspect of the present invention a fuse of a semiconductor device includes a number of first fuse metal formed at a predetermined interval over a substrate and a second fuse metal formed between the first fuse metals, wherein the first and second fuse materials being conductive and being different from each other.

The fuse preferably further includes a nitride layer provided below the second fuse metal.

The fuse preferably further includes a conductive layer formed on sidewalls of and below the second fuse metal.

The conductive layer preferably is made of TiN.
The first fuse metal preferably is copper (Cu).
The second fuse metal preferably is aluminum (Al).
The second fuse metal preferably is blown
The first fuse metal preferably define a recess that corresponds to a blowing region of the fuse
The second fuse metal preferably provided within the recess, A width of the recess is wider than the blowing portion of the fuse, so that the second fuse metal is configured to remain on sidewalls of the recess after a blowing operation to prevent the first fuse metal from migrating into the recess.

According to another aspect of the present invention, a method of forming a fuse of a semiconductor device includes forming a number of first fuse metals formed at predetermined intervals over an underlying structure and forming a second fuse metal formed between the first fuse metals, wherein the first and second fuse materials being conductive and being different form each other.

The forming the first fuse metals preferably includes forming a nitride layer and a trench oxide layer over the underlying structure that is provided over the substrate, forming a photoresist pattern on the trench oxide layer, etching the trench oxide layer and the nitride layer using the photoresist pattern as an etch mask, forming the first fuse metal over the etched trench oxide layer and the etched nitride layer, and removing the first fuse metal until the trench oxide layer is exposed.

The forming the second fuse metal preferably includes removing the trench oxide layer to define the recess, the recess being defined between the first fuse metals, depositing the second fuse metal within the recess and over the first fuse metals and removing the second fuse metal until the first fuse material is exposed.

The method preferably further includes forming a conductive layer on an entire surface after removing the trench oxide layer.

The method preferably further includes, after forming the second fuse metal within the recess, forming a dielectric interlayer exposing the second fuse metal, and etching the dielectric layer to define an opening the exposes the second fuse metal, the opening define a blowing region, wherein the opening enables a laser to irradiate the second fuse metal and blow the fuse, A width of the recess is wider than a laser spot of the laser that is used to irradiate the second fuse material.

The irradiating a laser to the second metal preferably is performed to expose a top surface of the underlying structure.

DESCRIPTION OF EMBODIMENT

Hereinafter, an embodiment of the present invention is described with reference to the accompanying drawings.

Figure 1:
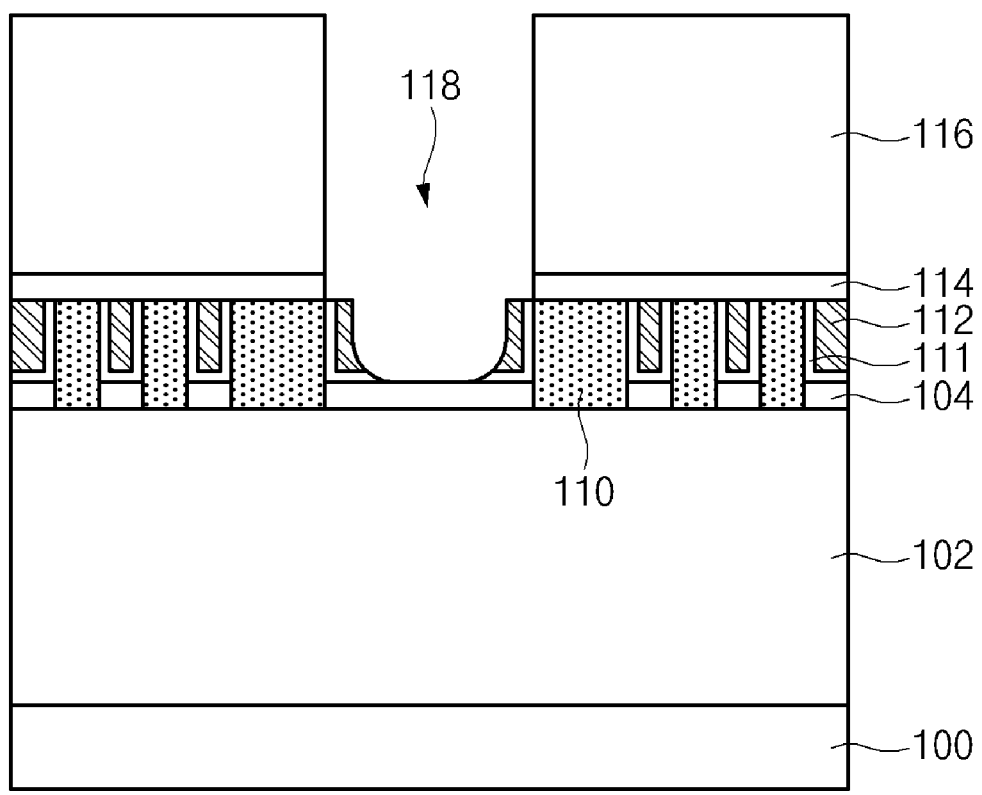
FIG. 1 is a cross-sectional view of a semiconductor device according to an embodiment of the present invention.

FIG. 1 is a cross-sectional view of a semiconductor device according to an embodiment of the present invention, and FIGS. 2a to 2j are cross-sectional views illustrating a method of forming the semiconductor device according to an embodiment of the present invention.

As shown in FIG. 1, the semiconductor device according to the embodiment includes two different fuse metals 110, 112 over a lower insulating layer 102. The fuse metal 110 includes copper (Cu), and the fuse metal 112 includes aluminum (Al). Although copper (Cu) and aluminum (Al), widely used as fuse metals, are described as an example, the fuse metal materials of the present invention are not limited to them, and may include other materials. In particular, aluminum (Al) can be replaced with materials capable of preventing the migration of copper (Cu) which can easily migrate under certain external environmental conditions of temperature, humidity, etc. A region where blowing is performed for the fuse metal 112 of the present invention is made of aluminum (Al). This is because, if the region where blowing is performed is made of aluminum (Al), the unblown fuse metal (Al) 112 remaining on the sidewalls of the fuse metal (Cu) 110 prevents the migration of copper (Cu) 110 under environmental conditions of high temperature, high humidity, etc., thereby improving reliability of the semiconductor device. An adhesive layer, e.g., TiN, may be included between the fuse metals 110, 112. The adhesive layer improves the bonding between the two fuse metals 110, 112.

Figure 2A:
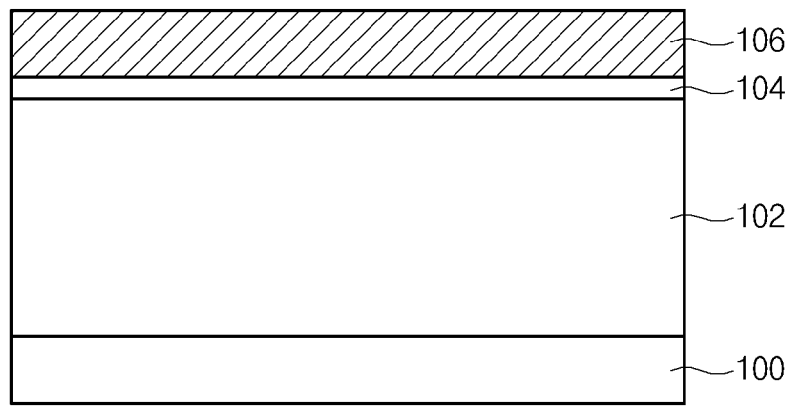
FIGS. 2a to 2j are cross-sectional views illustrating a method of forming the semiconductor device according to an embodiment of the present invention.
Figure 2B:
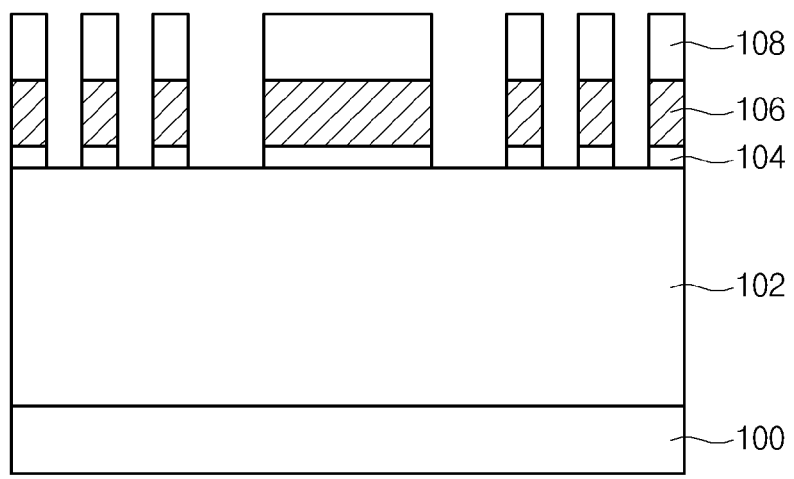

As shown in FIG. 2a, the lower insulating layer 102, a nitride layer 104, and a trench oxide layer 106 are formed over a semiconductor substrate 100. The lower insulating layer 102 may be an oxide layer. Referring to FIG. 2b, a photoresist pattern 108 is formed on the trench oxide layer 106. The lower insulating layer 102 is exposed by etching the trench oxide layer 106 and the nitride layer 104 using the photoresist pattern 108 as an etch mask. Next, the photoresist pattern 108 is removed.

Figure 2C:
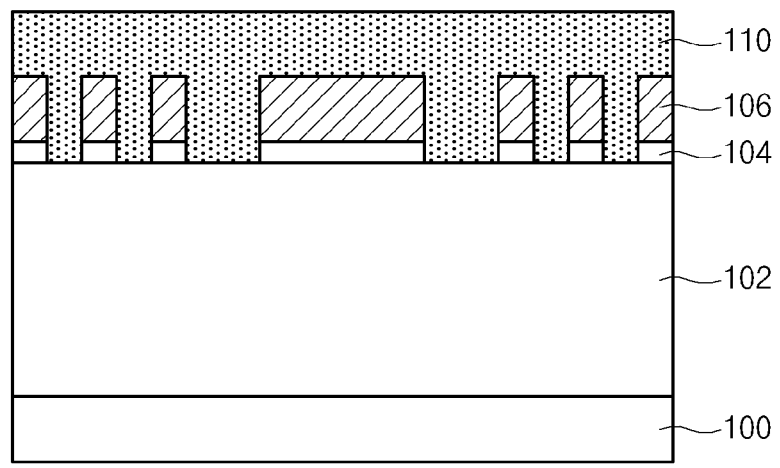
Figure 2D:
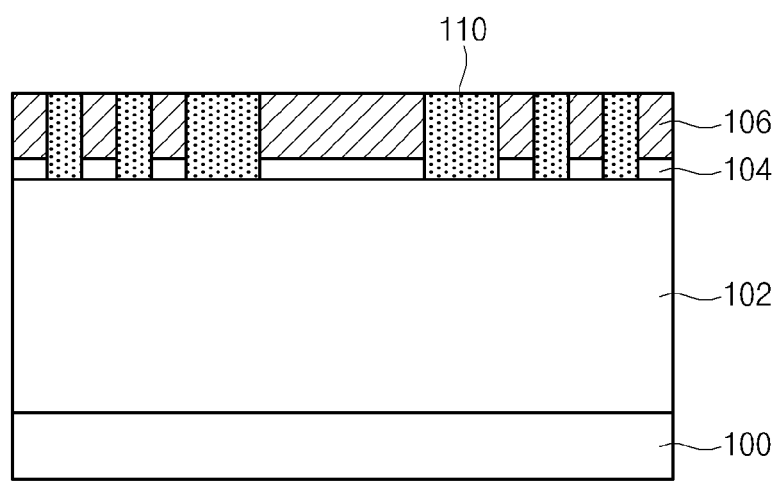

Referring to FIGS. 2c and 2d, the fuse metal 110 is formed on the entire surface. A polishing etch process is performed on the fuse metal 110 to thereby expose the trench oxide layer 106. The fuse metal 110 is copper (Cu). It is to be noted that the fuse metal is not limited to copper (Cu), but may include other materials. As a result of the polishing etch process, the fuse metals 110 are spaced apart from each other with the trench oxide layer 106 and the nitride layer 104 interposed therebetween. The fuse metals 110 are spaced apart from each other at regular intervals except near fuse blowing region where the spacing is larger. Here, a region where the fuse metals 110 are spaced farther apart from each other is a blowing region that that will be blown by a laser in a subsequent process.

Figure 2E:
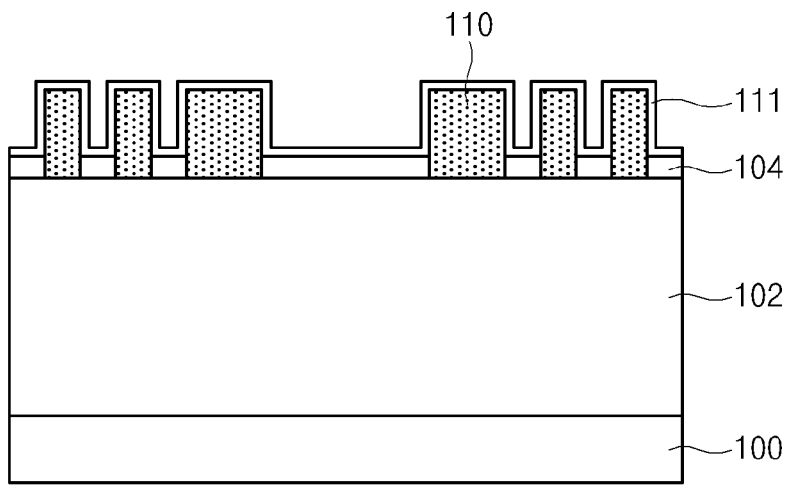

Referring to FIG. 2e, the trench oxide layer 106 provided between the fuse metals 110 is removed. Here, the underlying nitride layer 104 remains intact without being removed. A conductive layer 111 is formed on the entire surface. The conductive layer 111 includes the adhesive layer (e.g., TiN) and functions to increase adhesive strength between the two fuse metals 110, 112. It is to be noted that the conductive layer 111 is not limited to TiN, but may include any material capable of increasing adhesive strength between the two fuse metals 110, 112.

Figure 2F:
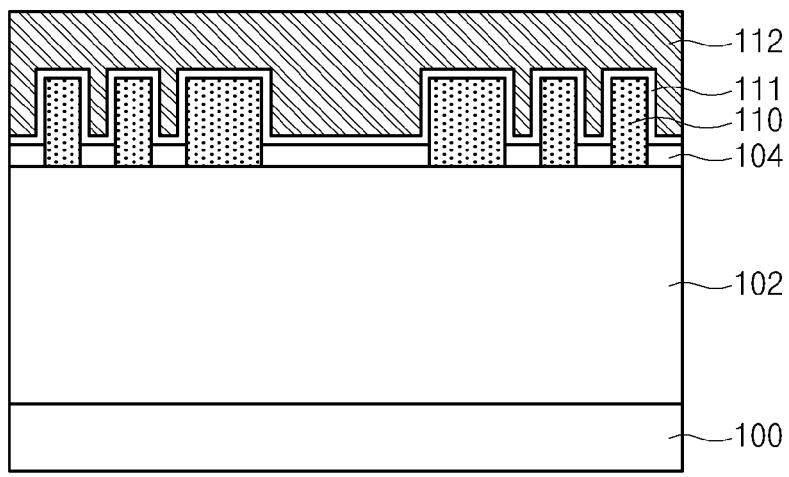
Figure 2G:
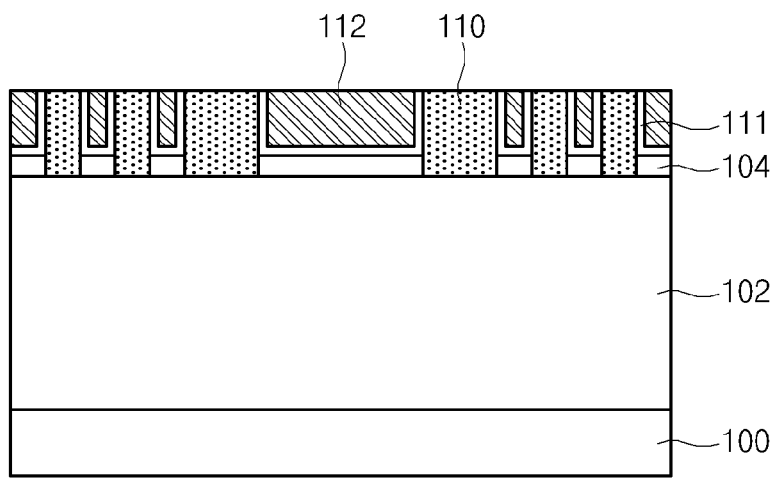

Referring to FIGS. 2f and 2g, after forming the fuse metal 112 on the entire surface, a polishing etch process is performed on the fuse metal 112, thereby exposing the fuse metals 110. The fuse metal 112 includes aluminum (Al). It is to be noted that the fuse metal 112 is not limited to aluminum (Al), but may include other materials. Aluminum (Al) sections between the fuse metal (Cu) 110 sections functions to prevent copper (Cu) from migrating under environments of specific temperature, specific humidity, etc. after a blowing process.

Figure 2H:
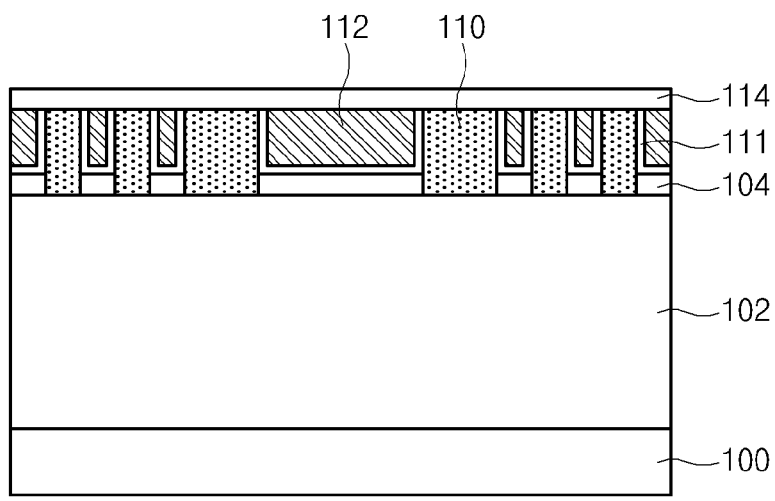
Figure 2I:
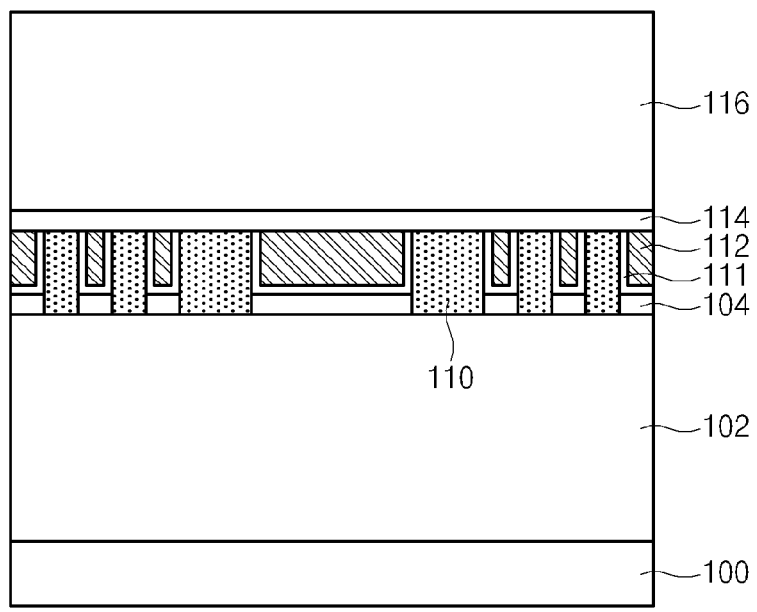

Referring to FIGS. 2h and 2i, after a nitride layer 114 is formed on the entire surface, a dielectric interlayer 116 is formed on the nitride layer 114.

Figure 2J:
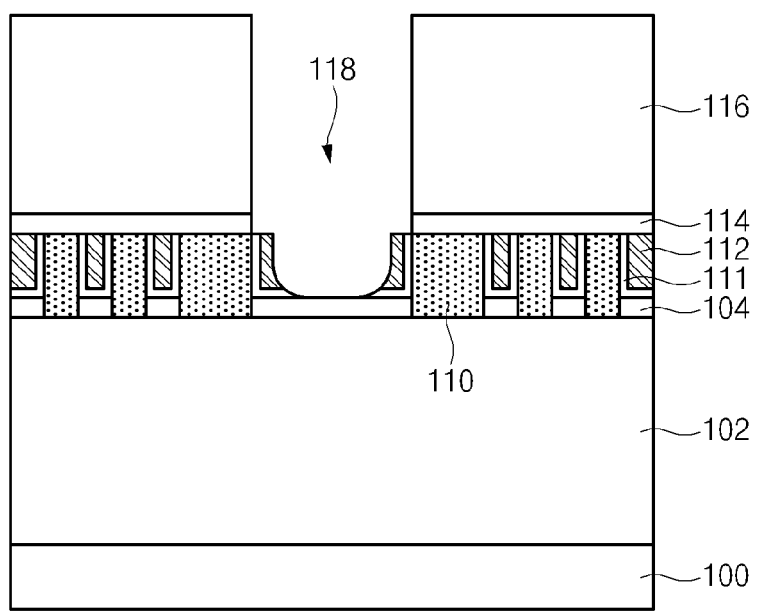

Referring to FIG. 2j, a photoresist pattern (not shown) through which a region to be blown is exposed is formed on the dielectric interlayer 116. The fuse metal 112 is exposed by etching the dielectric interlayer 116 and the nitride layer 114 using the photoresist pattern (not shown) as an etch mask. The exposed fuse metal 112 is blown using a laser 118, thereby exposing the underlying nitride layer 104 and possibly the insulating layer 102. Here, the size of a spot of the laser 118 may be smaller than the distance between copper sidewalls of the exposed fuse metal 112. As described above, if the fuse metal 112 having only a size corresponding to the size of the spot of the laser 118 is removed, aluminum (Al) of the fuse metal 112 remaining on the sidewalls of the fuse metal 110 functions to prevent copper (Cu) of the fuse metal 110 from migrating.

As described above, in accordance with the method of forming a semiconductor device according to the embodiment of the present invention, the fuse metal of aluminum (Al) is formed between the fuse metals of copper (Cu), and the fuse metal of aluminum (Al) is blown by a laser. Accordingly, copper (Cu) is not migrated under external environments, such as high temperature and high humidity. Thus, the reliability of a product including a semiconductor device can be improved.

The above embodiment of the present invention is illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM device) or non volatile memory device. Other additions, subtractions, or modifications are obvious in view of the present disclosure and are intended to fall within the scope of the appended claims.

What is claimed is:

1. A method of forming a semiconductor device, comprising:

forming a plurality of first fuse metal portions comprising a first fuse metal at predetermined intervals over a substrate;

forming a plurality of second fuse metal portions comprising a second fuse metal in first spaces between the first fuse metal portions;

exposing a fuse comprising one of the second fuse metal portions to form a blowing region in a second space disposed between the first fuse metal portions, wherein the second space is larger than the first space; and blowing the fuse so that remainder parts of the fuse remain over sidewalls of the second space;

wherein the first and second fuse metals are conductive and are different from each other.

2. The method according to claim 1, wherein the forming the first fuse metal portion includes:

forming a nitride layer and a trench oxide layer on an underlying structure that is provided over the substrate;

forming a photoresist pattern over the trench oxide layer;

etching the trench oxide layer and the nitride layer using the photoresist pattern as an etch mask;

forming the first fuse metal over the etched trench oxide layer and the etched nitride layer; and removing the first fuse metal until the trench oxide layer is exposed.

3. The method according to claim 2, wherein the forming the second fuse metal portions includes:

removing the trench oxide layer to define a recess, the recess being disposed between the first fuse metals;

depositing the second fuse metal within the recess and over the first fuse metal; and removing the second fuse metal until the first fuse metal is exposed.

4. The method according to claim 3, further comprising:

forming a conductive layer over the nitride layer after removing the trench oxide layer.

5. The method according to claim 3, further comprising, after removing the second fuse metal:

forming a dielectric interlayer over the second fuse metal; and etching the dielectric interlayer to expose the fuse, wherein the opening enables a laser to irradiate the second fuse metal and blow the fuse.

6. The method according to claim 5, wherein a width of the recess is wider than a laser spot of the laser that is used to blow the fuse.

7. The method according to claim 5, wherein blowing the fuse is performed to expose a top surface of the underlying structure.

* * * * *